United States Patent
Rao

(10) Patent No.: US 7,609,546 B2
(45) Date of Patent: Oct. 27, 2009

(54) MULTIVALUE MEMORY STORAGE WITH TWO GATING TRANSISTORS

(76) Inventor: G. R. Mohan Rao, 1404 Westmont Dr., McKinney, TX (US) 75070

( * ) Notice: Subject to any disclaimer, the term of this patent is extended or adjusted under 35 U.S.C. 154(b) by 0 days.

(21) Appl. No.: 11/872,510

(22) Filed: Oct. 15, 2007

(65) Prior Publication Data

US 2009/0097308 A1    Apr. 16, 2009

(51) Int. Cl.
*G11C 11/24* (2006.01)
(52) U.S. Cl. .................... 365/168; 365/149; 365/189.07
(58) Field of Classification Search .................. 365/168
See application file for complete search history.

(56) References Cited

U.S. PATENT DOCUMENTS

| 5,563,836 | A | | 10/1996 | Saito et al. |
| 5,623,440 | A | * | 4/1997 | Saito ........................... 365/149 |
| 5,771,187 | A | * | 6/1998 | Kapoor ......................... 365/149 |
| 5,808,932 | A | | 9/1998 | Irrinki et al. |
| 5,991,191 | A | | 11/1999 | Rao |
| 6,005,799 | A | | 12/1999 | Rao |
| 2005/0289293 | A1 | | 12/2005 | Parris et al. |

OTHER PUBLICATIONS

International Search Report and Written Opinion mailed Feb. 3, 2009 in PCT/US2008/079420.

* cited by examiner

*Primary Examiner*—Tan T. Nguyen
(74) *Attorney, Agent, or Firm*—Schwabe, Williamson & Wyatt, P.C.

(57) ABSTRACT

Digital memory devices and systems, as well as methods of operating digital memory devices, that include a multivalue memory cell with a first and a second gating transistor arranged in parallel, having a first and a second node, respectively, coupled to a storage element, and sensing circuitry coupled to a third and a fourth node of the first and second gating transistors, respectively, to sense a stored voltage of the memory cell. In embodiments, the first and second gating transistors are configured to activate at different threshold voltage levels.

25 Claims, 3 Drawing Sheets

MULTIVALUE MEMORY STORAGE WITH TWO GATING TRANSISTORS

FIELD OF THE DISCLOSURE

Embodiments of the disclosure relate to electronic circuits, in particular to digital memory devices with multivalue memory cells including two gating transistors.

BACKGROUND OF THE DISCLOSURE

Unlike typical dynamic random access memory (DRAM), multivalue memory cells are configured to store one of four voltage levels per memory cell corresponding to four different data values represented logically by two bits of data storage (such as the binary values "00", "01", "10", or "11"). Typical DRAM, by contrast, is configured to store one of two voltage levels corresponding to one bit of data storage (typically either a "1" or a "0"). U.S. Pat. No. 6,005,799 titled "METHODS AND CIRCUITS FOR SINGLE MEMORY DYNAMIC CELL MULTIVALUE DATA STORAGE" issued Dec. 21, 1999 discusses a multivalue dynamic random access memory (DRAM) device capable of sequential sensing of a stored voltage in a multivalue memory cell. Either the most significant bit (MSB) or the least significant bit (LSB) is sensed at a first step with the other bit sensed at a next step. These memory cells include a gating transistor and a storage element, such as a capacitor. Such sensing requires only two sense amplifiers, but sequential sensing imposes latency over concurrent sensing.

Concurrent sensing of multivalue bits using known techniques requires four sense amplifiers, each incorporating different reference voltages to sense the stored voltage. Such configurations include memory cells with one gating transistor and one capacitor coupled to a single bit line. Because all four sense amplifiers must use a different reference voltage, implementation and manufacturing of such sense amplifiers is complex.

DETAILED DESCRIPTION

Figure 1:
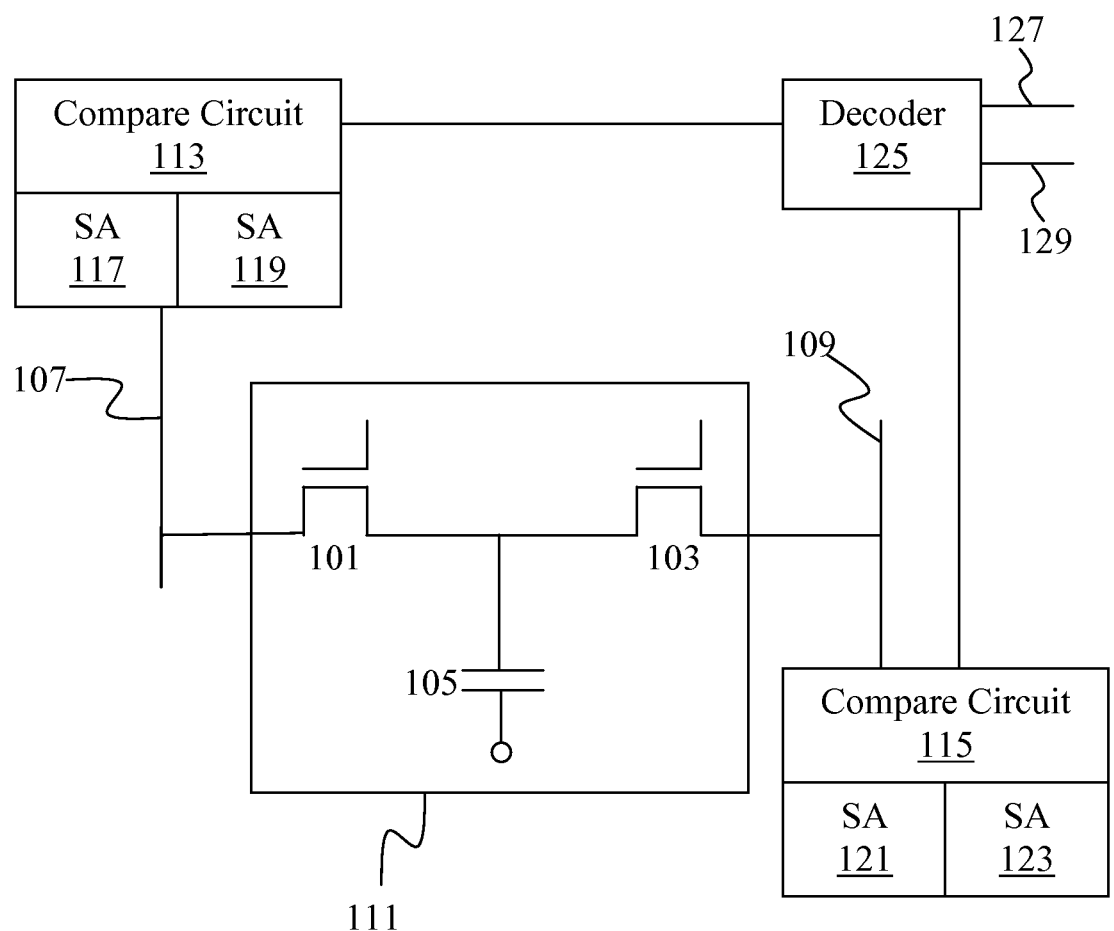
FIG. 1 depicts a functional block diagram of a two transistor and one capacitor multivalue memory cell coupled to sensing logic in accordance with various embodiments.

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of the present invention include a multivalue memory cell including two gating transistors arranged in parallel and a storage element such as a capacitor, onto which any one of four discrete voltages, or discrete voltage ranges, can be impressed; each voltage level or range of voltages may correspond in embodiments to a different data value represented by two bits of data (such as 00, 01, 10, or 11). Nodes of the gating transistors may connect to two separate bit lines coupling the memory cell to a sensing circuit containing two compare circuits and a decoder. Each compare circuit may contain one or two sense amplifiers. In embodiments, three or four sense amplifiers may utilize three or more distinct reference voltages to determine a stored voltage of the multivalue memory cell upon activation of a row line coupled to the gating transistors. In alternate embodiments, both pairs of sense amplifiers may use the same two reference voltages for sensing the stored voltage. In such embodiments, the gating transistors may be configured to activate upon different threshold voltages, thus enabling the gating transistors to act as part of the sensing logic.

Many voltages, voltage levels, and ranges of voltages are referenced throughout the specification. One of ordinary skill will recognize that these are exemplary only and are not meant to be read in a limiting sense and that embodiments are not limited to any particular voltages, voltage levels, ranges of voltage levels, or sets of voltages, voltage levels, and ranges of voltage levels. Also, one of ordinary skill will recognize that circuits in accordance with embodiments need not store or utilize, for example, exact reference, threshold, or storage voltages but may merely use any voltages within a range of voltages including the stated reference voltage, depending upon acceptable tolerances. Such acceptable tolerances may vary depending on engineering, design, manufacturing, environmental factors and requirements or other considerations. As used throughout the specification, voltage levels may be referred to by a particular voltage level (for example, a threshold voltage level of 1V), but are meant to be read in a non-limiting sense including such ranges of voltages as may be appropriate, depending on various considerations listed above. Also, one of ordinary skill will appreciate that elements described as "identical" need not be actually identical, but merely manufactured within a range of tolerances appropriate for a given application.

FIG. 1 depicts a functional block diagram of a two transistor and one capacitor multivalue memory cell coupled to sensing logic in accordance with various embodiments. Gating transistor 101 and gating transistor 103 may be arranged in parallel with a first node of gating transistor 101 coupled to storage element 105 and a second node of gating transistor 103 coupled to storage element 105. Storage element 105 may be capable of storing any one of four discrete voltage levels, or ranges of voltage levels, corresponding, in embodiments, to four discreet binary values represented logically as two bits such as, for example, "00", "01", "10", and "11". Embodiments are not limited to storage elements configured to store exactly four levels; in embodiments, storage element 205 may be configured to store three or more levels, such as for example eight or sixteen levels corresponding to three or four bits of binary data storage, respectively. In embodiments, storage element 105 may be a capacitor or other device capable of storing a voltage such as a latch. In embodiments, storage element 105 may be any device capable of storing voltage and/or current such as, for example, a static RAM (SRAM) memory cell. A third and fourth node of gating transistors 101 and 103 may be coupled to bit line 107 and bit line 109, respectively. In this way, gating transistors 101 and 103 plus storage element 105 may comprise multivalue memory cell 111.

Multivalue memory cell 111 may be coupled, via bit lines 107 and 109, to compare circuit 113 and compare circuit 115, respectively. Compare circuit 113 may comprise, in embodiments, sense amplifier 117 and sense amplifier 119. Compare circuit 115 may contain, in embodiments, sense amplifier 121 and sense amplifier 123. In alternative embodiments either of compare circuits 113 or 115 may contain only a single sense amplifier. In embodiments, the combined number of sense amplifiers within both compare circuit 113 and compare circuit 115 may total three or more sense amplifiers. In embodiments, the combined number of sense amplifiers within both compare circuit 113 and compare circuit 115 may total four sense amplifiers.

Gating transistors 101 and 103 may each be configured to activate when a row line (not shown) coupled to them is activated by a row decoder (not shown). Gating transistors 101 and 103 may be configured to activate, or "open" a circuit between storage element 105 and bit lines 107 and 109, when both a corresponding row line is activated and a stored voltage with storage element 105 exceeds a certain threshold voltage of gating transistors 101 and 103. In embodiments, the threshold voltage of gating transistors 101 and 103 may be the same. In alternative embodiments, the threshold voltage of gating transistors 101 and 103 may be different. In embodiments where the threshold voltages of gating transistors 101 and 103 are different, such threshold voltage levels may be configured such that gating transistors 101 and 103 may act as part of the sensing logic as discussed in more detail below.

In a first set of embodiments, the threshold values of 101 and 103 may be the same. In such embodiments, the reference voltages of sense amplifiers 117, 119, 121, and 123 may be set such that they are all different from one another. In embodiments only three sense amplifiers may be utilized, each with a different reference voltage. In embodiments, four sense amplifiers may be used with no more than two of them having the same reference voltage. Sense amplifiers 117, 119, 121, and 123 may act as compare circuits to compare the stored voltage within storage element 105 to their respective reference voltages. When the row line (not shown) of multivalue memory cell 111 is activated, gating transistors 101 and 103 may be configured to activate if the threshold voltage of gating transistors 101 and 103 is exceeded by the voltage stored within storage element 105. If such threshold voltage is exceeded, sensing circuits 113 and 115 may be configured to drive the voltage of bit lines 107 and 109, respectively, to the stored voltage of storage element 105. Each of sense amplifiers 117, 119, 121, and 123 may be configured to then compare the driven voltage to their respective reference voltages and output a result of the compare, to decoder 125. Decoder 125 may be configured to output on data lines 127 and 129 the most significant bit (MSB) and the least significant bit (LSB) of the determined stored binary value, respectively.

If the threshold voltage is not exceeded, then bit lines 107 and 109 may be driven to a low voltage state which may, in embodiments, correspond to the voltage level stored within storage element 105. If this occurs, then sense amplifiers 117, 119, 121, and 123 may be configured to sense the low voltage level on bit lines 107 and 109, respectively, and output the results of the compares to decoder 125. As one of ordinary skill in the art will appreciate, bit lines 107 and 109 may need to be precharged prior to any of the above operations occurring. Also, upon sensing of the stored voltage level within storage element 105, the stored voltage may be depleted and a refresh operation may be required.

Table 1 depicts logic states and outputs of sense amplifiers 117, 119, 121, and 123 in accordance with various embodiments of the first set of embodiments wherein the threshold voltages of gating transistor 101 and 103 are the same. In the example of table 1, a logical "00" is represented by a range of voltages from 0V to <1V; a logical "01" is represented by a range of voltages from 1V to <2V; a logical "10" is represented by a range of voltages from 2V to <3V; and a logical "11" is represented by a range of voltages 3V or greater. The $V_{REF}$ column indicates the reference voltage of the various sense amplifiers. The $V_{BL}$ rows indicate the voltage of the bit lines 107 and 109 upon activation of row lines coupled to gating transistors 101 and 103. For this example, the threshold voltages of gating transistors 101 and 103 are both set to 1V such that if the stored value within storage element 105 is 1V or greater (corresponding to either binary 01, 10, or 10), gating transistors 101 and 103 will both be activated (or "opened") upon activating the row line. The "Binary" columns indicate the result of the compares after activation of the gating transistors for each of the possible binary value corresponding to the voltage stored within storage element 105. An "H" in the "Binary" columns indicates that the result of the compare of the bit line voltages indicates that $V_{REF} > V_{BL}$, while an "L" indicates that the result of the compare of bit line voltages indicates that $V_{REF} \leq V_{BL}$. One of ordinary skill in the art will recognize that other voltages and ranges of voltages may be used in other embodiments without departing from the scope of embodiments of the present invention in any way. Thus, the example of table 1 is not meant to be limiting in any way and is meant only to ease understanding by way of example.

TABLE 1

| Element | $V_{REF}$ | Binary 00 | Binary 01 | Binary 01 | Binary 11 |
|---|---|---|---|---|---|
| SA 117 | 1 V | H | L | L | L |
| SA 119 | 2 V | H | H | L | L |
| SA 121 | 3 V | H | H | H | L |
| SA 123 | 4 V | H | H | H | H |
| $V_{BL}$ 107 | — | 0 V | 1 V | 2 V | 3 V |
| $V_{BL}$ 109 | — | 0 V | 1 V | 2 V | 3 V |

As can be seen from the $V_{BL}$ rows of table 1, when the threshold voltages of gating transistors 101 and 103 are the same, the voltages driven to bit lines 107 and 109 may be the same or similar no matter the stored value within storage element 105. In embodiments, decoder 125 may take as inputs the outputs of compare circuits 113 and 115, corresponding to the "L" or "H" results of sense amplifiers 117, 119, 121, and 123 to determine the binary value stored within storage element 105. In different embodiments, the "L" and "H" results may correspond to a binary "0" and a binary "1", respectively, or a binary "1" and a binary "0", respectively, or some other combination (for example some "L" results may correspond to a binary "0" while other "L" results may correspond to a binary "1" value, and so on).

As can also be seen from table 1, decoder 125 may be configured to determine the stored binary value using outputs from only three sense amplifiers. For example, if sense amplifier 123 were not used or ignored, a binary "00" would correspond to three "H" results, a binary "01" would correspond to one "L" result accompanied by two "H" results, a binary "10" would correspond to two "L" results accompanied by one "H" result, and a binary "11" would correspond to three "L" results. In other words, in the example of table 1, the output of sense amplifier 123 may not be necessary to determine the binary value stored within storage element 125. However, using four sense amplifiers may be desirable, in embodiments, to provide a "dummy" load to balance the circuit or to provide additional certainty that the results of the compare are accurate. In embodiments, the result of sense amplifier 123 may be ignored. The logic of decoder 125 may comprise any logic elements known in the art.

In a second set of embodiments, the threshold voltages of gating transistors 101 and 103 may be different. In such embodiments, the reference voltages of sense amplifiers 117, 119, 121, and 123 may be set such that, for example, sense amplifiers 117 and 121 are configured to utilize a first reference voltage and sense amplifiers 119 and 123 are configured to utilize a second reference voltage different from the first. In alternative embodiments, all four sense amplifiers may be configured to utilize different reference voltages. In embodiments, at least two of the sense amplifiers may be configured to utilize unique reference voltages. In embodiments only three sense amplifiers may be utilized, each with a different reference voltage. Sense amplifiers 117, 119, 121, and 123 may be configured to act as compare circuits to compare the stored voltage within storage element 105 to their respective reference voltages. When the row line (not shown) is activated, gating transistors 101 and 103 may be configured to activate (or "open") upon row line activation if the threshold voltage of each gating transistor is exceeded by the voltage stored within storage element 105. If such threshold voltage is exceeded, sensing circuits 113 and 115 may be configured to drive the voltage of bit lines 107 and 109, respectively, to the stored voltage of storage element 105. Each of sense amplifiers 117, 119, 121, and 123 may then be configured to compare the driven voltage to their respective reference voltages and output a result of the compare, to decoder 125. Decoder 125 may be configured to output on data lines 127 and 129 the most significant bit (MSB) and the least significant bit (LSB) of the stored binary data, respectively.

If the threshold voltages of either of gating transistor 107 and/or 109 are not exceeded, then either of bit lines 107 and 109, whose corresponding gating transistor threshold voltage was not exceeded, may be driven to a low voltage state which may or may not correspond to the voltage level stored within storage element 105. As one of ordinary skill in the art will appreciate, bit lines 107 and 109 may need to be precharged prior to any of the above operations occurring. Also, upon sensing of the stored voltage level within storage element 105, the stored voltage may be depleted and a refresh operation may be required.

Table 2 depicts logic states and outputs of sense amplifiers 117, 119, 121, and 123 in accordance with various embodiments of the second set of embodiments wherein the threshold voltages of gating transistors 101 and 103 are different. As with the example of table 1, a logical "00" is represented by a range of voltages from 0V to <1V; a logical "01" is represented by a range of voltages from 1V to <2V; a logical "10" is represented by a range of voltages from 2V to <3V; and a logical "11" is represented by a range of voltages 3V or greater. The $V_{REF}$ column indicates the reference voltage of the various sense amplifiers. The $V_{BL}$ rows indicate the voltage of bit lines 107 and 109 upon activation of a row line coupled to gating transistors 101 and 103. For this example, the threshold voltage of gating transistor 101 is set to 1V and the threshold voltage of gating transistor 103 is set to 2V. The "Binary" columns indicate the result of the compares after activation of the gating transistors for each of the possible binary values corresponding to the voltage stored within storage element 105. As with table 1, an "H" indicates that the result of the compare of the bit line voltages indicates that $V_{REF} > V_{BL}$ while an "L" indicates that the result of the compares of bit line voltages indicates that $V_{REF} \leq V_{BL}$. One of ordinary skill in the art will recognize that other voltages and ranges of voltages may be used without departing from the scope of the present invention. Thus, the example of table 2 is not meant to be limiting in any way and is meant only to ease understanding by way of example.

TABLE 2

| Element | $V_{REF}$ | Binary 00 | Binary 01 | Binary 01 | Binary 11 |
|---|---|---|---|---|---|
| SA 117 | 1 V | H | L | L | L |
| SA 119 | 3 V | H | H | H | L |
| SA 121 | 1 V | H | H | L | L |
| SA 123 | 3 V | H | H | H | L |
| $V_{BL}$ 107 | — | 0 V | 1 V | 2 V | 3 V |
| $V_{BL}$ 109 | — | 0 V | 0 V | 2 V | 3 V |

As can be seen from table 2, when the threshold voltages of gating transistors 101 and 103 are different, the voltages driven to bit lines 107 and 109 may not always be the same for each stored value. Particular reference is made in this regard to the "Binary 01" column of the example of table 2. In embodiments, decoder 125 may be configured to take the "L" or "H" results of sense amplifiers 117, 119, 121, and 123 as inputs to determine the binary value stored within storage element 105. In various embodiments, the "L" and "H" results may correspond to a binary "0" and a binary "1", respectively, or a binary "1" and a binary "0", respectively, or some other combination (for example some "L" results may correspond to a "0" while other "L" results may correspond to a "1" value, and so on).

Looking at the example of table 2, it can be seen that in the second set of embodiments of the present invention wherein the threshold voltages of gating transistors 101 and 103 are different, sense amplifiers 117 and 121 may use a first reference voltage and sense amplifiers 119 and 123 may use a second reference voltage. Compare circuits 113 and 115 may therefore have identical or similar designs which may, in embodiments, ease implementation and/or manufacturing of such devices. The threshold voltage levels of gating transistors 101 and 103 may be set such that they in essence act as part of the sensing logic thereby allowing compare circuits 113 and 115 to be identical or nearly identical. For example, referring to the "Binary 01" column of table 2, even though SA 117 and SA 121 utilize the same reference voltage (1V), the results of the compares are different due to the fact that VBL 107 is driven to a voltage of between 1V and <2V while VBL 109 is driven to a voltage of less than 1V upon activation of the row line. This is because gating transistor 101 has a threshold voltage of 1V while gating transistor 103 has a threshold voltage of 2V. Thus, upon activation of the row line, only gating transistor 101 may be activated or "open" and drive the stored value (1V to <2V) to bit line 107. Gating transistor 103 may not be activated, and bit line 109 may be driven to a voltage level less than 1V, even though the stored value within storage element 105 may be between 1V and <2V. Therefore, a sense amplifier with a 2V reference voltage may not be needed to fully sense the stored voltage level.

As can also be seen from table 2, decoder 125 may be configured to determine the stored binary value using only outputs from three sense amplifiers. For example, if sense amplifier 123 were not used or ignored, a binary "00" would correspond to three "H" results, a binary "01" would correspond to one "L" result and two "H" results, a binary "10" would correspond to two "L" results and one "H" result, and a binary "11" would correspond to three "L" results. In other words, in the example of table 2, the output of sense amplifier 123 may not be necessary to determine the binary value stored within storage element 125. However, a fourth sense amplifier may be desirable, in embodiments, to provide a "dummy" load to balance the circuit or to provide additional certainty that the results of the compares are accurate. In embodiments, the result of sense amplifier 123 or some other sense amplifier may be ignored.

As discussed above, the examples in tables 1 and 2 are exemplary only and are meant only to ease understanding of the present invention by way of example. They are not meant to be limiting in any way and one of ordinary skill will appreciate that other examples could be given without departing from the scope of the various embodiments of the present invention.

Figure 2:
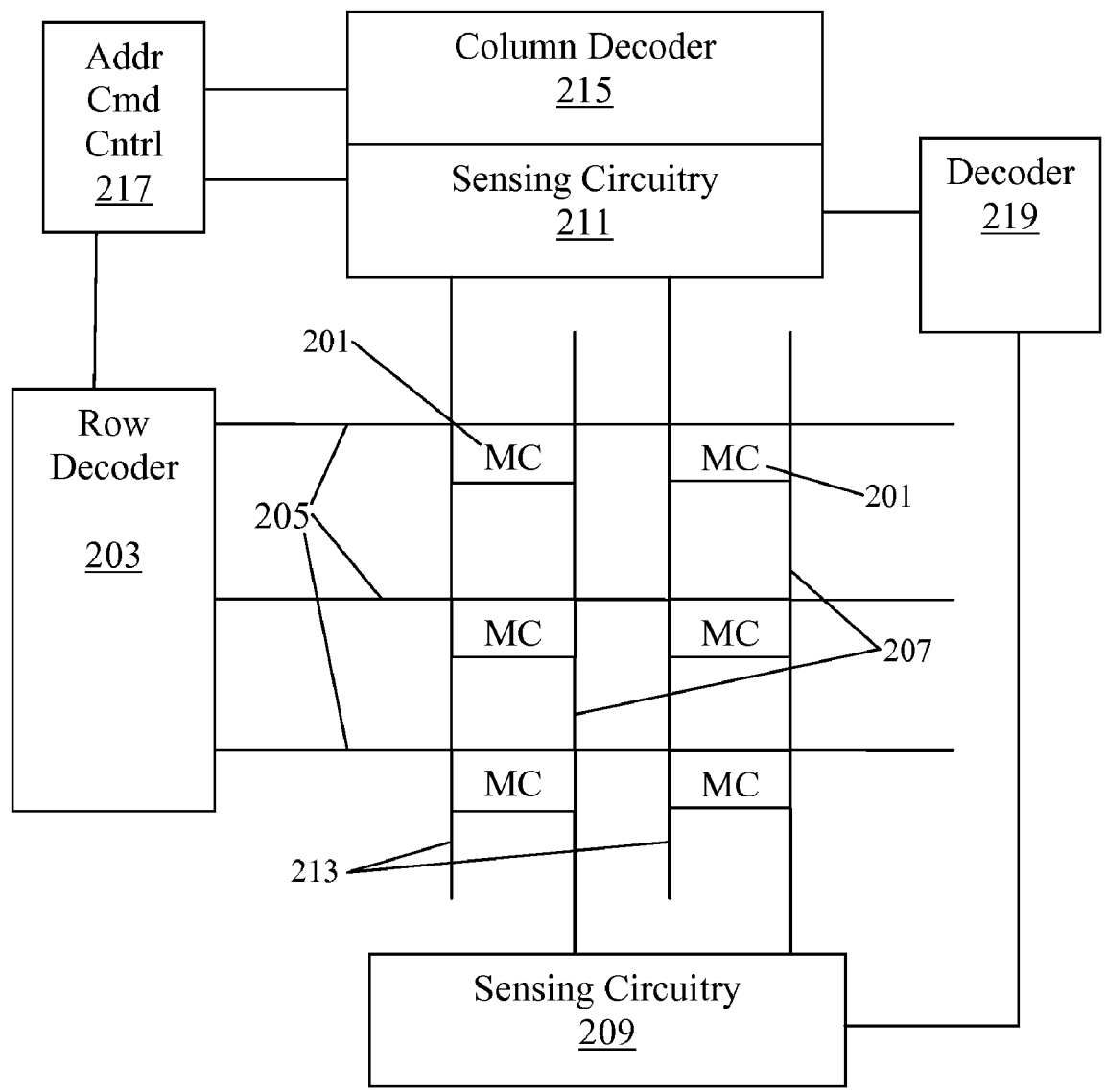
FIG. 2 depicts a functional block diagram of a memory array utilizing multivalue memory cells in accordance with the present invention.

FIG. 2 depicts a functional block diagram of a memory array utilizing multivalue memory cells in accordance with the present invention. Multivalue memory device 200 may include a plurality of multivalue memory cells 201 such as, for example, the multivalue memory cell of FIG. 1. Each multivalue memory cell 201 may be attached to a row decoder 203 via a plurality of row lines 205. Each multivalue memory cell 201 may be coupled to compare circuit 209 via one of plurality of bit lines 207 and to compare circuit 211 via one of plurality of bit lines 213. Column decoder 215 may also be coupled to compare circuit 211 and/or 209. Precharge circuitry (not shown) may also be coupled to bit lines 213 and bit lines 207 and may, in embodiments be incorporated within compare circuit 211 and/or 209.

Address/command/control circuitry 217 may be configured to receive a command to READ or WRITE a data value to a corresponding address given by either an internal or external memory controller (not shown). Address/command/control circuitry 217 may be configured to wholly or partially decode the received address and pass along a row portion and a column portion of the received address to row decoder 203 and column decoder 215, respectively. Row decoder 203 may be configured to activate one of row lines 205 corresponding to the row portion of the received address and column decoder 215 may be configured to cause the sensing of bit lines 207 and 213 corresponding to a column portion of the received address. Sensing circuits 211 and 209 may be configured to output results of compares of the driven bit line voltages to various reference voltages to decoder 219, as discussed above with respect to FIG. 1. Decoder 219 may be configured to decode the results of the compares to determine the binary values stored within multivalue memory cells 201 corresponding to the received address.

Figure 3:
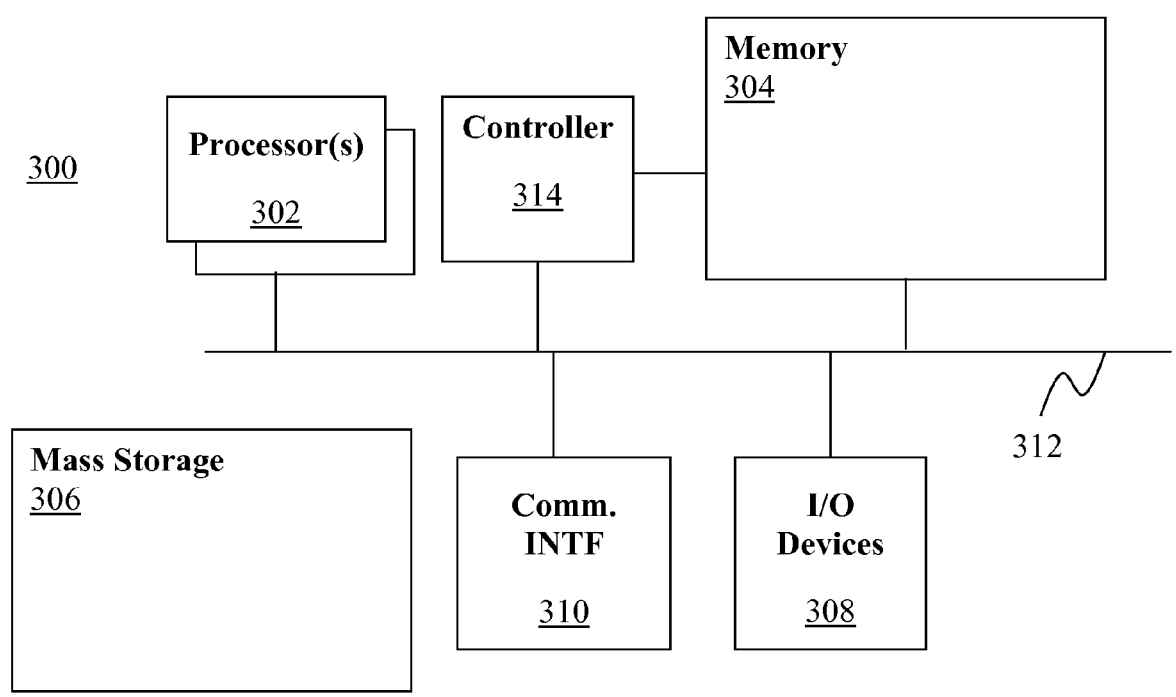
FIG. 3 depicts a computer system suitable for practicing embodiments of the present invention.

FIG. 3 depicts a computer system suitable for practicing embodiments of the present invention. As shown, computing system/device 300 may include one or more processors 302, and system memory 304, such as for example the multivalue memory devices of FIG. 2 and/or FIG. 1. Additionally, computing system/device 300 may include mass storage devices 306 (such as diskette, hard drive, CDROM and so forth), input/output devices 308 (such as keyboard, cursor control and so forth) and communication interfaces 310 (such as network interface cards, modems and so forth). The elements may be coupled to each other via system bus 312, which represents one or more buses. In the case of multiple buses, they may be bridged by one or more bus bridges (not shown). Finally, controller 314 embodied with some or all of the teachings of the present invention may be provided and configured to operate memory 304. In embodiments, controller 314 may be configured to issue READ and WRITE access commands to memory 304 and also to issue precharge commands to memory 304 in accordance with various embodiments of the present invention. In alternative embodiments, memory 304 may include a controller (not shown) to perform some or all of the functions of controller 314. In embodiments, some or all of the functions of controller 314 could be effectively implemented within memory 304. In embodiments, such functions may be performed by use of a mode register within memory 304. Just as an example, in embodiments a mode may be set using the mode register such that precharge occurs at the beginning or set such that precharge occurs at the end of a cycle.

Other than the teachings of the various embodiments of the present invention, each of the elements of computer system/device 300 may perform its conventional functions known in the art. In particular, system memory 304 and mass storage 306 may be employed to store a working copy and a permanent copy of programming instructions implementing one or more software applications.

Although FIG. 3 depicts a computer system, one of ordinary skill in the art will recognize that embodiments of the present invention may be practiced using other devices that utilize DRAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art. L In various embodiments, the earlier described memory cells are embodied in an integrated circuit. The integrated circuit may be described using any one of a number of hardware design language, such as but not limited to VHDL or Verilog. The compiled design may be stored in any one of a number of data format, such as but not limited to GDS or GDS II. The source and/or compiled design may be stored on any one of a number of medium such as but not limited to DVD.

Although specific embodiments have been illustrated and described herein for purposes of description of the preferred embodiment, it will be appreciated by those of ordinary skill in the art that a wide variety of alternate and/or equivalent implementations may be substituted for the specific embodiment shown and described without departing from the scope of the present invention. Also, those with skill in the art will readily appreciate that the present invention may be implemented in a very wide variety of embodiments. This application is intended to cover any adaptations or variations of the embodiments discussed herein.

What is claimed is:

1. An apparatus comprising:
    a multivalue memory cell including a first gating transistor, a second gating transistor, and a storage element, wherein the storage element is coupled to both the first gating transistor and the second gating transistor;
    a first bit line coupled to the first gating transistor;
    a second bit line coupled to the second gating transistor; and
    sensing circuitry coupled to both the first bit line and the second bit line, wherein the sensing circuitry is configured to:
        compare a first bit-line voltage, driven to the first bit line, to a first reference voltage;
        compare the first bit-line voltage to a second reference voltage, wherein the first reference voltage and the second reference voltage are different; and
        compare a second bit-line voltage, driven to the second bit-line, to a third reference voltage.

2. The apparatus of claim 1, further comprising a decoder coupled to the sensing circuitry, wherein the decoder is configured to decode a stored voltage level of the storage element based at least on outputs of the sensing circuitry.

3. The apparatus of claim 2, wherein the sensing circuitry further comprises a first compare circuit coupled to the first bit line and a second compare circuit coupled to the second bit line.

4. The apparatus of claim 2 wherein the sensing circuitry further comprises first and second sense amplifiers coupled to the first bit line and a third sense amplifier coupled to the second bit line.

5. The apparatus of claim 4, wherein the first and second sense amplifiers are configured to compare the first bit-line voltage to the first and second reference voltages, respectively, and wherein the third sense amplifier is configured to compare the second bit-line voltage to the third reference voltage.

6. The apparatus of claim 5, wherein the sensing circuitry further comprises a fourth sense amplifier coupled to the second bit line and configured to compare the second bit-line voltage to a fourth reference voltage.

7. The apparatus of claim 4, wherein the first gating transistor is configured with a first threshold voltage level, and wherein the second gating transistors is configured with a second threshold voltage level.

8. The apparatus of claim 7, wherein the first reference voltage and the third reference voltage are the same, and wherein the first threshold voltage level and the second threshold voltage level are different.

9. The apparatus of claim 7, wherein the first reference voltage and the third reference voltage are different, and wherein the first threshold voltage level and the second threshold voltage level are the same.

10. An article of manufacture, comprising a plurality of computer-readable hardware design instructions, or compilation of the hardware design instructions, wherein the hardware design instructions, if executed by a processor, specify an implementation of the apparatus as set forth in claim 1 as an integrated circuit.

11. A method of detecting a plurality of data bits stored in a multivalue memory cell, the method comprising:
activating, by memory control circuitry, both a first gating transistor of the multivalue memory cell and a second gating transistor of the multivalue memory cell, wherein the first gating transistor is coupled to a first bit line, and wherein the second gating transistor is coupled to a second bit line;
comparing, by sensing circuitry, a first reference voltage to a first bit-line voltage of the first bit line;
comparing, by the sensing circuitry, a second reference voltage to the first bit-line voltage; and
comparing, by the sensing circuitry, a third reference voltage to a second bit-line voltage of the second bit line, wherein the first reference voltage and the second reference voltage differ.

12. The method of claim 11, wherein said comparing a first reference voltage to a first bit-line voltage and said comparing a second reference voltage to the first bit-line voltage is performed by a first compare circuit of the sensing circuitry, and wherein said comparing a third reference voltage to a second bit-line voltage is performed by a second compare circuit of the sensing circuitry.

13. The method of claim 12, further comprising decoding, by a decoder coupled to the first and second compare circuits, the plurality of data bits based at least on outputs of the first and second compare circuits.

14. The method of claim 12, wherein the first compare circuit comprises first and second sense amplifiers, and wherein the second compare circuit comprises a third sense amplifier.

15. The method of claim 14, wherein said comparing by the first compare circuit further comprises comparing, by the first and second sense amplifiers, the first and second reference voltages, respectively, to the first bit-line voltage, and wherein said comparing by the second compare circuit comprises comparing, by the third sense amplifier, the second bit-line voltage to the third reference voltage.

16. The method of claim 14, wherein the second compare circuit further comprises a fourth sense amplifier, and wherein said comparing by the second compare circuit further comprises comparing, by the fourth sense amplifier, the second bit-line voltage to a fourth reference voltage.

17. The method of claim 11, wherein the first gating transistor is configured with a first threshold voltage level and the second gating transistors is configured with a second threshold voltage level, wherein the first reference voltage and the third reference voltage are same, and wherein the first threshold voltage and the second threshold voltage are different.

18. The method of claim 11, wherein the first gating transistor is configured with a first threshold voltage level and the second gating transistor is configured with a second threshold voltage level, wherein the first reference voltage and the third reference voltage are different, and wherein the first threshold voltage and the second threshold voltage are the same.

19. A system, comprising:
a digital memory device including:
a plurality of multilevel memory cells, at least one multivalue memory cell comprising a first gating transistor, a second gating transistor, and a storage element, wherein the storage element is coupled to both the first gating transistor and the second gating transistor;
a first bit line coupled to the first gating transistor;
a second bit line coupled to the second gating transistor; and
sensing circuitry coupled to both the first bit line and the second bit line, wherein the sensing circuitry is configured to:
compare a first bit-line voltage, driven to the first bit line, to a first reference voltage;
compare the first bit-line voltage to a second reference voltage, wherein the first reference voltage and the second reference voltage are different; and
compare a second bit-line voltage, driven to the second bit line, to a third reference voltage; and
a memory controller coupled to the digital memory device via a data bus and configured to read and write data from the memory device via the memory bus.

20. The system of claim 19, further comprising a decoder coupled to the sensing circuitry, wherein the decoder is configured to decode a stored voltage level of the storage element based at least on outputs of the sensing circuitry.

21. The system of claim 20, wherein the sensing circuitry comprises first and second sense amplifiers coupled to the first bit line and a third sense amplifier coupled to the second bit line, and wherein the first and second sense amplifiers are configured to compare the stored voltage to the first and second reference voltages, respectively, and wherein the third sense amplifier is configured to compare the stored voltage to the third reference voltage.

22. The system of claim 19, wherein the first gating transistor is configured with a first threshold voltage level and the second gating transistor is configured with a second threshold voltage level wherein the first threshold voltage level is different from the second threshold voltage level, and wherein the first reference voltage and the second reference voltage are the same.

23. The system of claim 19, wherein the first gating transistor is configured with a first threshold voltage level and the second gating transistor is configured with a second threshold voltage level, wherein the first threshold voltage level is the same as the second threshold voltage level, and wherein the first reference voltage and the second reference voltage are different.

24. An apparatus, comprising:
means for activating first and second gating transistors of a multivalue memory cell, wherein the first and second gating transistors are coupled to a storage node of the multivalue memory cell; and
means for comparing:
a first reference voltage to a first bit-line voltage of the first bit line;
a second reference voltage to the first bit-line voltage, wherein the first reference voltage and the second reference voltage are different; and
a third reference voltage to a second bit-line voltage of the second bit line.

25. The apparatus of claim 24, further comprising means for decoding a binary value corresponding to a stored voltage level stored in the storage element based at least on outputs of the means for comparing.

* * * * *

UNITED STATES PATENT AND TRADEMARK OFFICE
CERTIFICATE OF CORRECTION

PATENT NO.       : 7,609,546 B2
APPLICATION NO.  : 11/872510
DATED            : October 27, 2009
INVENTOR(S)      : G. R. Mohan Rao It is certified that error appears in the above-identified patent and that said Letters Patent is hereby corrected as shown below:

Column 8, line 42, "An apparatus comprising:" should read --An apparatus, comprising:--.
Column 9, line 1, "The apparatus of claim 2 wherein" should read --The apparatus of claim 2, wherein--.
Column 10, line 11, "second gating transistors is" should read --second gating transistor is--.

Signed and Sealed this

Fifteenth Day of December, 2009

David J. Kappos
*Director of the United States Patent and Trademark Office*